(12) United States Patent
Yanagida

(10) Patent No.: US 6,504,241 B1
(45) Date of Patent: Jan. 7, 2003

(54) STACKABLE SEMICONDUCTOR DEVICE AND METHOD FOR MANUFACTURING THE SAME

(75) Inventor: Toshiharu Yanagida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/418,238

(22) Filed: Oct. 14, 1999

(30) Foreign Application Priority Data

Oct. 15, 1998 (JP) .......................... 10-294155
Oct. 30, 1998 (JP) .......................... 10-311057
Dec. 25, 1998 (JP) .......................... 10-371006

(51) Int. Cl.[7] ............................. H01L 23/02
(52) U.S. Cl. .................. 257/686; 257/723; 257/724; 257/738; 257/778; 257/780; 257/786; 228/180.22; 361/748; 361/761; 361/768; 361/777; 361/784; 361/790; 361/792
(58) Field of Search ................. 257/685, 686, 257/737, 738, 723, 724, 777, 778, 780, 786; 361/748, 760, 761, 768, 777, 784, 790, 792; 228/180.22

(56) References Cited

U.S. PATENT DOCUMENTS

| | | | |
|---|---|---|---|
| 5,594,275 A | * | 1/1997 | Kwon et al. ................. 257/686 |
| 5,608,265 A | * | 3/1997 | Kitano et al. ................ 257/738 |
| 5,854,507 A | * | 12/1998 | Miremadi et al. ........... 257/686 |
| 5,883,426 A | * | 3/1999 | Tokuno et al. ............... 257/686 |
| 5,973,392 A | * | 10/1999 | Senba et al. ................. 257/686 |
| 5,995,379 A | * | 11/1999 | Kyougoku et al. .......... 361/803 |
| 6,051,887 A | * | 4/2000 | Hubbard ....................... 257/777 |
| 6,072,233 A | * | 6/2000 | Corisis et al. ............... 257/686 |
| 6,180,881 B1 | * | 1/2001 | Isaak .......................... 174/52.4 |
| 6,303,997 B1 | * | 10/2001 | Lee .............................. 257/778 |

FOREIGN PATENT DOCUMENTS

KR 1999-60237 * 12/1999

* cited by examiner

Primary Examiner—David L. Talbott
Assistant Examiner—Alonzo Chambliss
(74) Attorney, Agent, or Firm—Bell, Boyd & Lloyd LLC

(57) ABSTRACT

There is provided a semiconductor device having a semiconductor chip in which a first protrusion electrode is formed on the semiconductor substrate; and an intermediate substrate which comprises a base substrate, a first external terminal provided in said base substrate, which is joined to said first protrusion electrode, a second external terminal provided in said base substrate, an electrode section being exposed on both surfaces of said base substrate, and a second protrusion electrode formed at one end face of said second external terminal, a plurality of said intermediate substrates being stacked in layers by joining said second protrusion electrode to the other end face of said second external terminal, thus enabling miniaturizing and lightening electronic equipment and realizing high reliability and high performance.

5 Claims, 8 Drawing Sheets

STACKABLE SEMICONDUCTOR DEVICE AND METHOD FOR MANUFACTURING THE SAME

RELATED APPLICATION DATA

The present application claims priority to Japanese Application No. P10-294155 filed Oct. 15, 1998; Japanese Application No. P10-311057 filed Oct. 30, 1998 and Japanese Application No. P10-371006 filed Dec. 25, 1998 which applications are incorporated herein by reference to the extent permitted by law.

BACKGROUND OF THE INVENTION

1. Field of the Invention

The present invention relates to the method for manufacturing a semiconductor device and retrofitting of a semiconductor device and more particularly to a semiconductor manufacturing method and a semiconductor device based on the structure of a semiconductor substrate disposed on a printed wiring board (PWB).

2. Description of the Related Art

Digital video cameras, digital portable telephones, and portable electronic equipment such as notebook type personal computers has recently been widely popular and this has increased the need for smaller, thinner, and more lightweight portable equipment.

To realize the size reduction, thinning, and weight reduction of the portable equipment, the increase in part mounting density is an important problem.

In particular, a high density mounting technique has been developed and put to practical use. In the technique, a flip-chip semiconductor device has been used as a semiconductor device such as a semiconductor IC instead of a package semiconductor device.

There is provided a method for mounting such a flip-chip type semiconductor device (flip-chip mounting), that is, for example, such a method that solder ball bumps are formed on the Al electrode pad, and respective connection terminals of the semiconductor IC chip are made to abut on the solder ball bumps, and the IC chip is then mounted directly on the printed wiring board.

There is provided a method by using electrolytic plating as a method for manufacturing the above mentioned solder balls. According to this method, there is a problem that since the thickness of solder deposited by electrolytic plating is affected by the state of the surface of a primary material layer and slight fluctuation of electric resistance, it is fundamentally difficult to form solder ball bumps with even heights in one IC chip.

As a method for manufacturing solder ball bumps so as to correct the unevenness of the heights of the solder ball bumps, there is provided film deposition by vacuum deposition and pattern forming of photoresist films using lift-off method.

Such methods are carried out for example as shown in FIG. 4.

First, as shown in FIG. 9A, the electrode 1 for a flip-chip type semiconductor IC 1 is formed in the following manner.

The electrode section 1a comprises an electrode pad 3 comprised of Al—Cu alloy formed on a semiconductor substrate 2 comprised of silicon by sputtering and etching, a silicon oxide film formed on the electrode pad 3 so as to cover the whole surface of the semiconductor substrate 2, a surface protection film 4 comprised of polyimide, an opening 4a formed in the region of the electrode pad 3 of the surface protection film, and a ball limiting metal (BLM) film 5, that is, a metallic multilayer film comprised of, for example, Cr, Cu, Au, and so on which is formed by sputtering so as to cover the surface of the electrode pad 3 exposed at the side and bottom of the opening 4.

To form a solder ball bump on the electrode 1a of the semiconductor IC chip 1, as shown in FIG. 9B, a resist film 6 having an opening 6a in the region of the above BLM film 5 is formed.

Subsequently, as shown in FIG. 9C, a solder deposition film 7 is deposited on the resist film 6 so as to cover the whole surface of the semiconductor substrate 2.

After that, as shown in FIG. 9D, by lift-off of the resist film 6, unnecessary portions of the solder deposition film 7 is removed to form a desired pattern of the solder deposition film.

Lastly, as shown in FIG. 9E, by melting the solder of the solder deposition film 7 by thermal treatment, almost spherical solder ball bump 7a is formed based on the surface tension of solder.

SUMMARY OF THE INVENTION

In view of the above points, it is an object of the present invention to provide the semiconductor device and the method for manufacturing the same which enable thin and lightweight electronic equipment and realize high reliability and best functions of the electronic equipment.

According to the present invention, thin and lightweight electronic equipment can be manufactured and there can be provided a semiconductor device and the method for manufacturing the same with high reliability and high performance.

According to the first aspect of the present invention, the above object can be attained by the semiconductor device having: a semiconductor chip in which a first protrusion electrode is formed on the semiconductor substrate; and an intermediate substrate which comprises a base substrate, a first external terminal provided in the base substrate, which is joined to the first protrusion electrode, a second external terminal provided in the base substrate, an electrode section being exposed on both surfaces of the base substrate, and a second protrusion electrode formed at one end face of the second external terminal, a plurality of the intermediate substrates being stacked in layers by joining the second protrusion electrode to the other end face of the second external terminal.

According to the configuration of the first aspect, the semiconductor-chip-mounted intermediate substrates are stacked in layers by connecting the second protrusion electrode and the second outer terminal. This reduces the length of wiring between semiconductor chips, enabling high-speed signal processing with inductance reduced. Further, stacking semiconductor chips in layers can realize higher density mounting than two-dimensional mounting, enabling manufacturing small-sized and lightweight semiconductor devices and further manufacturing small-sized and lightweight electronic equipment.

According to the second aspect of the present invention, the above object can be attained by a semiconductor device in the configuration of the fist aspect, wherein thinning is adopted for the surface of the semiconductor chip on which the first protrusion electrode is not formed in the semiconductor substrate to thin the semiconductor substrate.

According to the configuration of the second aspect, a semiconductor chip is processed by grinding, polishing, and etching so that the thickness of the semiconductor chip is reduced. When the semiconductor chips and intermediate substrates are stacked in layers, the length in the direction of the stacking in layers is not therefore increased, and so the semiconductor device can be both miniaturized and lightened.

According to the third aspect of the present invention, the above object can be attained by a semiconductor device in the configuration of the second aspect, wherein the thickness of the semiconductor chip is formed into approx. 200 $\mu$m or less.

According to the configuration of the third aspect, the semiconductor chip is processed to approx. 200 $\mu$m or less. When the semiconductor chips and intermediate substrates are stacked in layers, the length in the direction of the stacking in layers is not therefore increased, and so the semiconductor device can be both miniaturized and lightened.

According to the fourth aspect of the present invention, the above object can be attained by a semiconductor device in the configuration of the first aspect, wherein the thickness of the base substrate of said intermediate substrate is formed into approx. 200 $\mu$m or less.

According to the configuration of the fourth aspect, the intermediate substrate is processed to approx. 200 $\mu$m or less. When the semiconductor chips and intermediate substrates are stacked in layers, the length in the direction of the stacking in layers is not therefore increased, and so the semiconductor device can be both miniaturized and lightened.

According to the fifth aspect of the present invention, the above object can be attained by a semiconductor device in the configuration of the first aspect, wherein resin is filled on the surface where the first protrusion electrodes are formed in the semiconductor chip.

According to the configuration of the fifth aspect, filling resin around the first protrusion electrode increases the strength of connection between the first protrusion electrode and the base substrate, thus enabling improving the reliability of the semiconductor device.

According to the sixth aspect of the present invention, the above object is attained by a semiconductor device in the configuration of the first aspect, wherein the thickness in the direction of stacking in layers in the second protrusion electrode is formed into approx. 300 $\mu$m or less.

According to the configuration of the sixth aspect, the second protrusion electrode is processed in the direction of stacking in layers so that the thickness reaches approx. 300 $\mu$m or less. When the semiconductor chips and intermediate substrates are stacked in layers, the length in the direction of the stacking in layers is not therefore increased, and so the semiconductor device can be effectively miniaturized removing surplus space and can be lightened.

According to the seventh aspect of the present invention, the above object is attained by the method for manufacturing a semiconductor device in which: a first protrusion electrode is formed on the surface of a semiconductor substrate, and a semiconductor chip manufactured thin is joined to a first external terminal provided for the base substrate of an intermediate substrate, a second protrusion electrode is formed at one end of a second external terminal whose electrode is exposed at both surfaces of the base substrate, the second external terminal being provided for the base substrate of the intermediate substrate, and a plurality of the intermediate substrates are stacked in layers by joining the second protrusion electrode to the other surface of the second external terminal.

According to the configuration of the seventh aspect, the semiconductor-chip-mounted intermediate substrates are stacked in layers by the second protrusion electrode and the second outer terminal.

A method for manufacturing the semiconductor device as claimed in claim 7, wherein a first protrusion electrode is formed on a wafer, resin is filled on the surface where said first protrusion electrode is formed, the surface on which said first protrusion electrode on said wafer is not formed is processed so that the thickness of said wafer is thinned, and said wafer is diced into a desired size to form said semiconductor chip. This reduces the length of wiring between semiconductor chips, enabling high-speed signal processing with inductance reduced. Further, stacking semiconductor chips in layers can realize higher density mounting than two-dimensional mounting, enabling manufacturing small-sized and lightweight semiconductor devices and further manufacturing small-sized and lightweight electronic equipment.

Further, a semiconductor chip is processed by grinding, polishing, and etching so that the thickness of the semiconductor chip is reduced. When the semiconductor chips and intermediate substrates are stacked in layers, the length in the direction of the stacking in layers is not therefore increased, and so the semiconductor device can be both miniaturized and lightened.

According to the eighth aspect of the present invention, the above object is attained by a method for manufacturing the semiconductor device in the configuration of the seventh aspect, wherein a first protrusion electrode is formed on a wafer, resin is filled on the surface where the first protrusion electrode is formed, the surface on which the first protrusion electrode on said wafer is not formed is processed so that the thickness of the wafer is thinned, and the wafer is diced into a desired size to form the semiconductor chips.

According to the configuration of the eighth aspect, a semiconductor chip is processed by grinding, polishing, and etching so that the thickness of the semiconductor chip is reduced. When the semiconductor chips and intermediate substrates are stacked in layers, the length in the direction of the stacking in layers is not therefore increased, and so the semiconductor device can be both miniaturized and lightened.

Further, filling resin around the first protrusion electrode increases the strength of connection between the first protrusion electrode and the base substrate, thus enabling improving the reliability of the semiconductor device.

According to the eleventh aspect of the present invention, the above object is attained by a method for manufacturing the semiconductor device in the configuration of the seventh aspect, wherein the semiconductor chip is processed so that the thickness of the semiconductor chip is approx. 200 $\mu$m or less.

According to the configuration of the eleventh aspect, the semiconductor chip is processed to approx. 200 $\mu$m or less. When the semiconductor chips and intermediate substrates are stacked in layers, the length in the direction of the stacking in layers is not therefore increased, and so the semiconductor device can be both miniaturized and lightened.

According to the twelfth aspect of the present invention, the above object is attained by a method for manufacturing the semiconductor device in the configuration of the seventh aspect, wherein the second protrusion electrode is formed so that the thickness for the multi-layering direction of the intermediate substrate is approx. 300 µm or less.

According to the configuration of the twelfth aspect, the second protrusion electrode is processed to approx. 200 µm or less in the direction of stacking in layers. When the semiconductor chips and intermediate substrates are stacked in layers, the length in the direction of the stacking in layers is not therefore increased, and so the semiconductor device can be both miniaturized and lightened.

According to the thirteenth aspect of the present invention, the above object is attained by a method for manufacturing the semiconductor device in the configuration of the seventh aspect, wherein a third protrusion electrode is formed on the surface of the wafer, resin is filled on the surface where the third protrusion electrode is formed, the tip of the third protrusion electrode is removed and a fourth protrusion electrode is provided on the third protrusion electrode to form the first protrusion electrode.

According to the thirteenth aspect of the present invention, filling resin around the third protrusion electrode increases the strength of connection between the third protrusion electrode and the base substrate improving the reliability of the semiconductor device. Further, the tip of the third protrusion electrode is removed and the fourth protrusion electrode is formed on the third protrusion electrode. Resin attached to the tip of the third protrusion electrode is removed by grinding the tip of the third protrusion electrode to reduce the resistance of connection between the third and fourth protrusion electrodes. Moreover, forming the fourth protrusion electrodes on the third protrusion electrodes by a ball transfer method evens the height of the first protrusion electrodes, thus improving the reliability of flip-chip mounting.

Generally, the forming of the above solder ball bump 7a is performed on the semiconductor wafer, that is, in the state prior to dicing of the wafer into respective semiconductor IC 1 chips.

The semiconductor ICs 1 on whose electrodes the solder bumps 7a are formed in the above manner are diced out of the wafer-shaped semiconductor substrate 2.

Further, the solder ball bumps 7a of respective semiconductor ICs 1 are made abutted on the lands formed on the printed wiring board on which the semiconductor ICs to be mounted.

Consequently, to miniaturize electronic equipment, a substrate is reduced in size, enabling manufacturing smaller-sized and more lightweight electronic equipment.

It is desirable that the space of mounting electronic parts on the substrate is as small as possible for portable electronic equipment such as IC cards, portable telephones, and personal digital assistants (PDAs). The mounting space in electronic equipment must therefore be further reduced in size.

However, in consideration of only two-dimensional space, there is a limit on miniaturization of electronic parts, and so a mounting space must be designed from the viewpoint of not only two-dimensional direction, but also three-dimensional direction. The semiconductor devices for electronic equipment to be reduced in size and weight have therefore been expected.

DETAILED DESCRIPTION OF THE PREFERRED EMBODIMENTS

The following describes the preferable embodiments of the present invention in details. Because the embodiments to be described below are preferable embodiments of the present invention, the embodiments have technically preferable various limits. However, the scope of the present invention is not limited to these embodiments unless there are the explanation that the present invention is limited to something in the description below.

Figure 1:
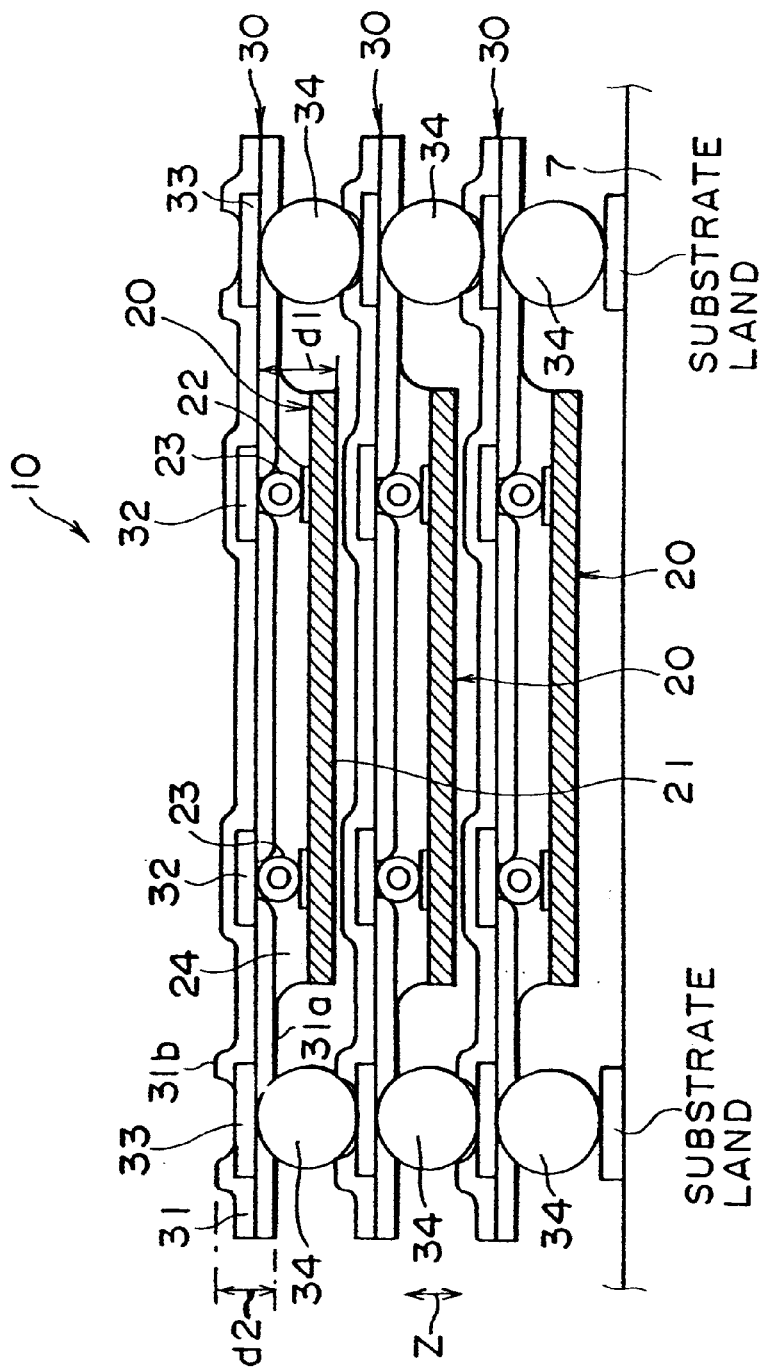
FIG. 1 is a configuration diagram showing the preferable embodiment of the semiconductor device of the present invention.

FIG. 1 is a structural view showing the preferable embodiment of the semiconductor device of the present invention, and a semiconductor device 10 is explained referring to FIG. 1.

The semiconductor device 10 comprises a plurality of semiconductor chips 20, a plurality of intermediate substrates 30, and so on. A semiconductor chip 20 has a semiconductor substrate 21, electrode pads 22, inner bumps 23 which are first protrusion electrodes, and so on. An integrated circuit (LSI) is formed on the semiconductor substrate 21, and the electrode pads 22 are formed on the surface of the integrated circuit. The electrode pads 22 are joined to the inner bumps 23, and thus the semiconductor substrate 21 communicates signals or suchlike with an external device via the electrode pads 22 and the inner bumps 23.

Where, the semiconductor chip 20 has been formed so that the thickness d1 reaches 200 µm or less. When the semiconductor substrates 21 and the intermediate substrates 30 are stacked in layers as shown in FIG. 1, thinning of the whole thickness of the semiconductor device therefore enables the manufacturing of small-sized and lightweight electronic equipment.

Resin 24 is filled on the surface where the inner bumps 23 of the semiconductor chip 20 are formed. The resin 24 increases the strength of connection between the semiconductor chip 20 and the intermediate substrate 30 via the inner bumps 23. In further detail, in the resin 24, when a stress by the thermal stress at added temperature cycles is concentrated at the bumps of junction due to the difference in coefficient of thermal expansion between the silicon chip and the glass epoxy substrate, the whole resin eases the stress concentration enabling improving of the reliability of the junctions.

The intermediate substrate comprises a base substrate 31, an inner land 32 which is a first external terminal, an outer land 33 which is a second external terminal, outer bumps 34, and so on. The base substrate 31 is made of, for example, polyimide, glass epoxy, alumina, ceramic, and so on, and is formed so that the thickness d2 is 200 μm a or less. The reduction of the thickness d2 enables thinning of the whole semiconductor device 10. An inner land 32 and an outer land 33 are formed in the base substrate 31. For example, the inner land 32 is formed at the side of the inner peripheral surface of the base substrate 31, and the outer land 33 is formed at the side of the outer peripheral surface of the base substrate 31.

The inner land 32 is exposed only to one end face 31a of the base substrate 31, and is joined to the inner bump 23.

On the other hand, the outer land 33 is exposed to both end faces 31a and 31b, and outer bumps 34 are provided at one end face 31a of the outer land 33. The outer bump 34 is formed so that the height d3 of the outer bump 34 is, for example, 300 μm or less, thus enabling further thinning of the semiconductor device 10 in the direction (arrow Z direction) of stacking intermediate substrates 30 in layers.

On the other hand, the outer bump 34 provided in another intermediate substrate 30 is joined at the other end face 31b of the outer land 33, thus enabling stacking a plurality of intermediate substrates 30 and semiconductor chips 30 in layers.

Concretely, as shown in FIG. 1, for example, three intermediate substrates 30 in which semiconductor chips are installed are stacked in layers by joining outer lands 33 and outer bumps 34, respectively, and the outer bumps 34 of the intermediate substrate 30 which is the lowest as shown in FIG. 1 are joined to the substrate lands of the printed wiring board (PWB), thereby semiconductor chips 20 conventionally formed in two dimensions can be formed in three dimensions, thus enabling manufacturing smaller-sized semiconductor device 10. Further, the semiconductor chip 20 and intermediate substrate 30 are formed so that the thickness d1 of the semiconductor chip 20 and the thickness d2 of the intermediate substrate 30 are 200 μm or less, respectively, thus enabling manufacturing a thin and lightweight semiconductor device. Moreover, by using such semiconductor devices 10, small-sized and lightweight electronic equipment can also be manufactured.

FIGS. 2 to 5 are drawings showing the preferable embodiment of the method for manufacturing the semiconductor device of the present invention. The following describes the method for manufacturing the semiconductor device 10 referring to FIGS. 1 to 5.

Figure 2A:
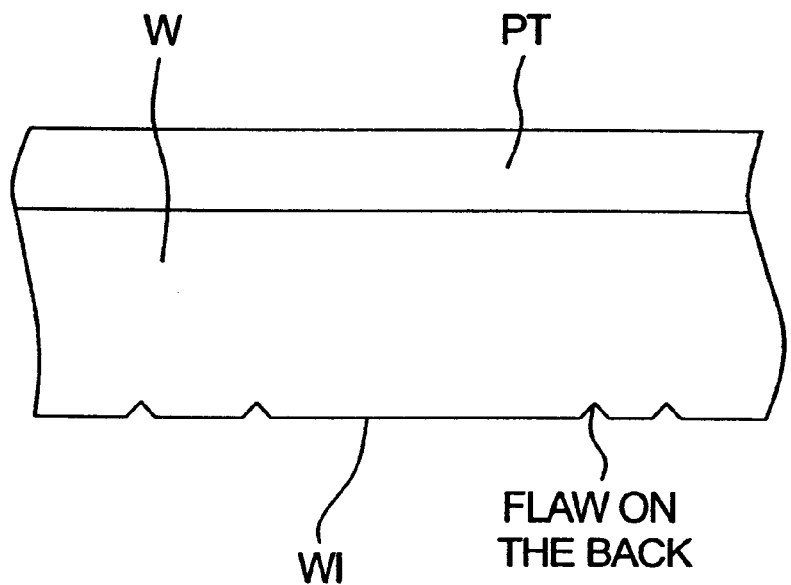
FIGS. 2A and 2B show the state of wafer thinning in the method for manufacturing the semiconductor device of the present invention.

First, as shown in FIG. 2A, an integrated circuit (LSI) is manufactured on a wafer W, and inner bumps 23 are formed on the surface of the LSI. Then, a protective tape PT is pasted on the surface where the inner bumps 23 are formed. At this time, flows are irreversibly formed on the back of the waver W where no integrated circuit is formed, that is, on the back W1.

Figure 2B:
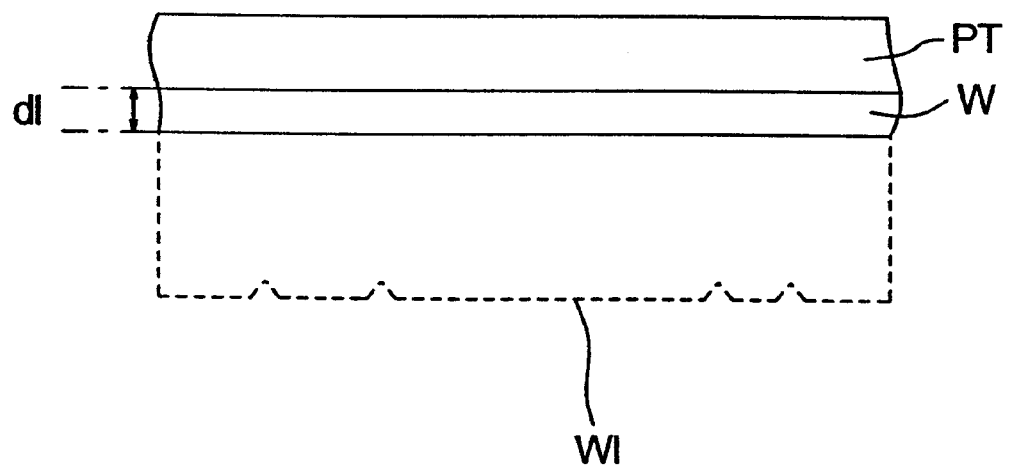

Further, as shown in FIG. 2B, the back of the wafer W is ground to thin the wafer so that the thickness d1 of the wafer W reaches 200 μm.

Figure 3:
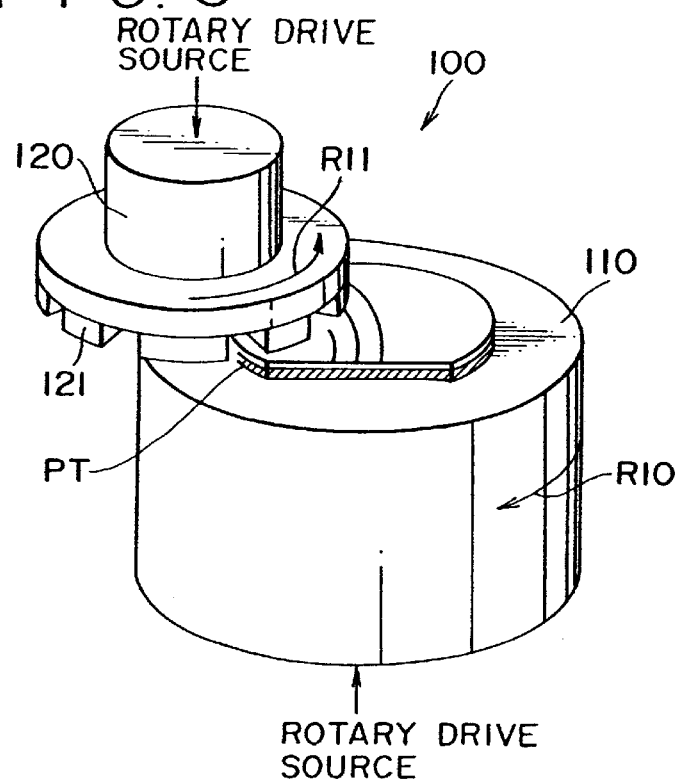
FIG. 3 shows the mechanical grinder which is used during wafer thinning in the method for manufacturing the semiconductor device of the present invention.
Figure 4:
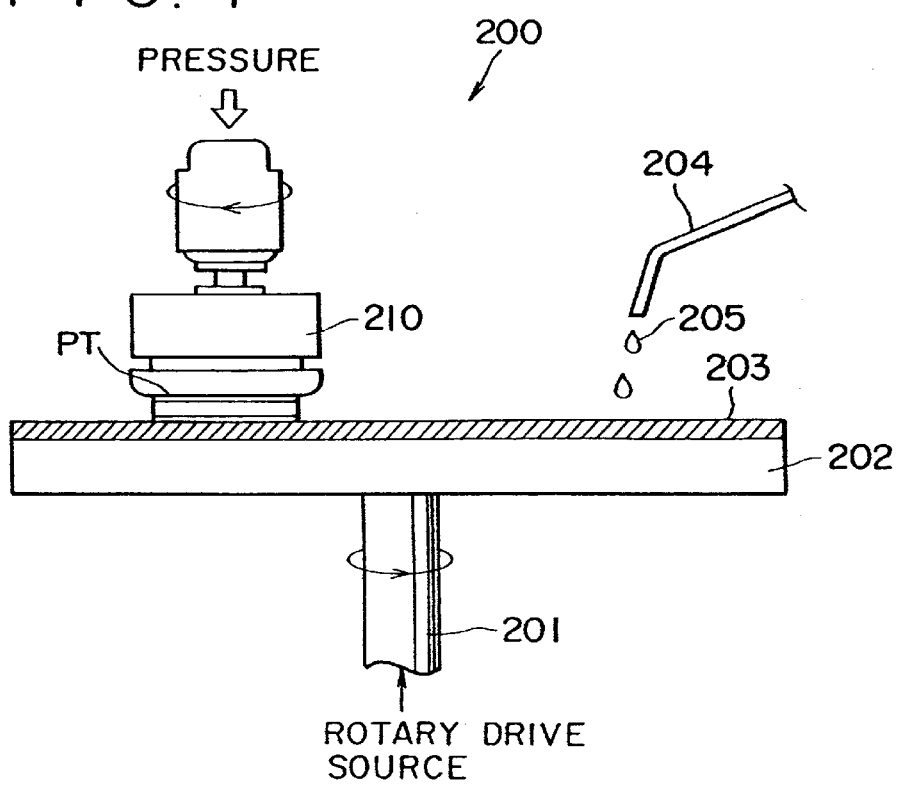
FIG. 4 shows the chemical mechanical polishing (CMP) machine which is used during wafer thinning in the method for manufacturing the semiconductor device of the present invention.

Concretely, the grinding machine 100 as shown in FIG. 3 and the polishing machine 200 as shown in FIG. 4 such as a chemically polishing apparatus are used to adjust the thickness of the wafer W.

First, the grinding machine 100 comprises a wafer holding means provided rotatably in the direction of arrow R10 by means of a rotary drive source and the grinding means 120, provided rotatably by means of a rotary drive source, in which a grinding stone 121 is installed.

The wafer W is disposed so that the protective tape PT touches the wafer holding means 110, and the grinding means 120 grinds the back W1 of the wafer W. Concretely, the wafer W is ground at 150 μm/min. of the feed speed of the grinding stone 121 and at 2500 rpm of the rotation speed of the grinding stone 121 so that the thickness of the wafer W reaches approx. 110 μm.

Next, the back W1 of the wafer W is ground so that the thickness dl of the wafer W, for example, reaches 100 μm. In this case, a chemical mechanical polishing (CMP) machine 200 shown in FIG. 4, for example, is used as a polishing machine which gives less chemical machining damage.

In FIG. 4, the polishing machine 200 comprises a surface table 202 rotatably driven by a rotary shaft 201, a polishing cloth 203 attached on the top of the surface table 202, a wafer carrier 210 which is rotatably driven and supports the waver, and a nozzle 204 which drops a polishing solvent on the surface table 202.

Further, the back W1 of the wafer W is polished by the wafer carrier 210 which rotatably drives pressing the wafer W against the polishing cloth 203 on the surface table 202. In this case, the back of the wafer is polished, for example, at the polishing pressure of 400 g/cm$^2$, at the oscillation speed of 2 mm/s, and at the slurry supply speed of 40 ml/min. with the finishing allowance of approx. 10 μm until the thickness d1 of the wafer W reaches approx. 100 μm.

As the result, new damages caused by grinding such as flaws are removed, enabling increasing the mechanical strength of the waver W thinned up to the thickness of 100 μm.

In other words, if there is a flaw on the back of the wafer W, the strength of the flaw portion is decreased and there is a danger that breakage of the wafer begins from the flaw portion. However, removing damages such as flaws on the back of the wafer increases the strength of the wafer W even if it is thinned.

Figure 5A:
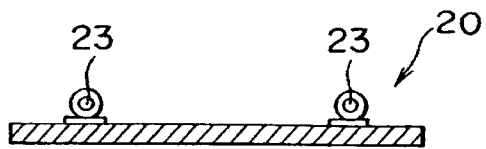
FIGS. 5A to 5D are process diagrams showing a preferable embodiment of the manufacturing method for the semiconductor device of the present invention.

Further, the polished wafer W is diced and a semiconductor chip 20 is finished as shown in FIG. 5A.

Figure 5B:
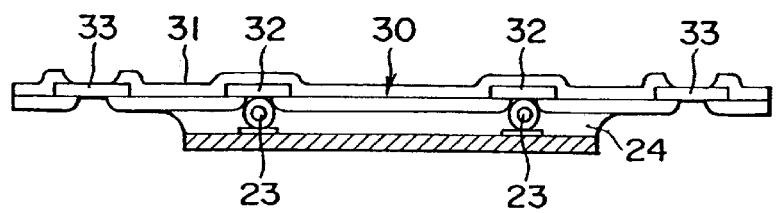

Next, as shown in FIG. 5B, there is provided a base substrate 31 made of polyimide and formed to the thickness d2 of approx. 150 μm. Further, the inner lands 32 of the base substrate 31 are joined to the inner bumps by, for example, flip-chip mounting and after that, resin 24 is filled between the semiconductor chip 20 and the intermediate substrate 30.

Figure 5C:
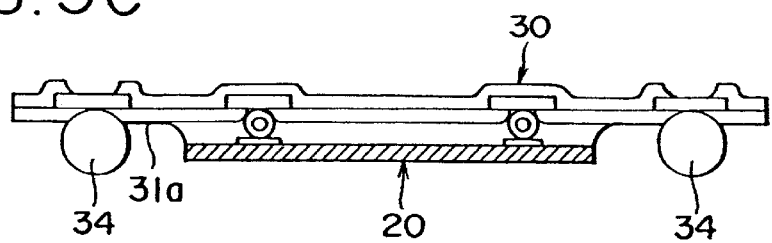

Further, as shown in FIG. 5C, outer bumps 34 made of eutectic solder are joined to outer lands 33. At this time, an outer bump 34 is transferred on the other surface 31a, that is, on the surface where the semiconductor chip 20 is mounted so that the thickness d3 of the outer bump 34 is, for example, only 300 μm. The outer bump thickness of 300 μm thus eliminates a surplus of space for stacking semiconductor substrates in layers, further enabling effective high-density three-dimensional mounting with a minimum mounting height.

Figure 5D:
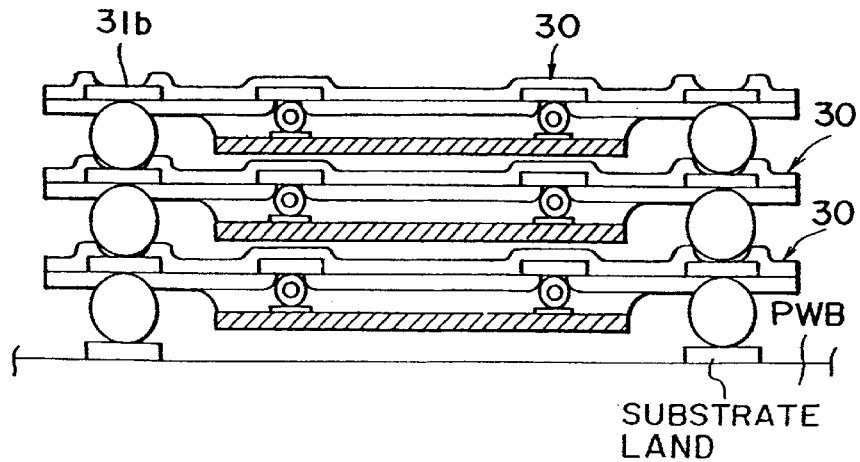

Lastly, as shown in FIG. 5D, a plurality of intermediate substrates having outer bumps 34 are joined to the outer land 33 of another intermediate substrate to stack the substrates in layers. Further, a plurality of the intermediate substrates stacked in layers are all reflowed by the reflowing machine not shown to complete a semiconductor device 10.

Stacking the thinned semiconductor substrates 21 and intermediate substrates 30 in layers to form the semiconductor device 10 thus realizes, without increasing the mounting height, three-dimensional mounting of high-performance semiconductor devices being capable of high-speed signal processing with inductance reduced because of short wiring length between semiconductor substrates 21.

If a thermal stress occurs between the semiconductor substrates 21 and the printed wiring boards 30, the whole resin 24 accepts and eases the thermal stress because the inner bumps 23 are fixed by means of the resin 24. The junction portions of the inner bumps 23 are therefore prevented from being broken, improving the reliability of the solder bumps.

Another Preferred Embodiment

Figure 6A:
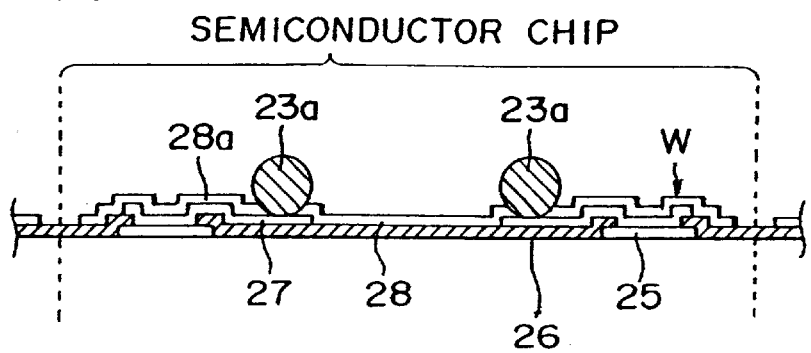
FIGS. 6A to 6D are process diagrams showing another embodiment of the manufacturing method for the semiconductor device of the present invention.
Figure 6B:
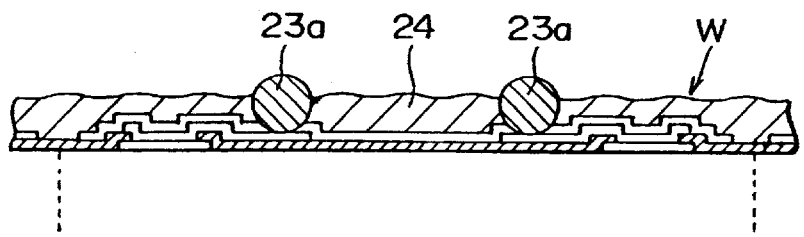
Figure 6C:
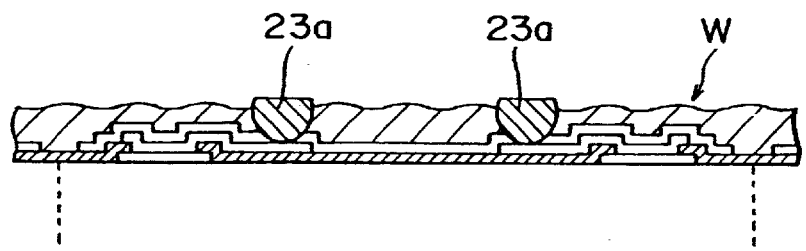
Figure 6D:
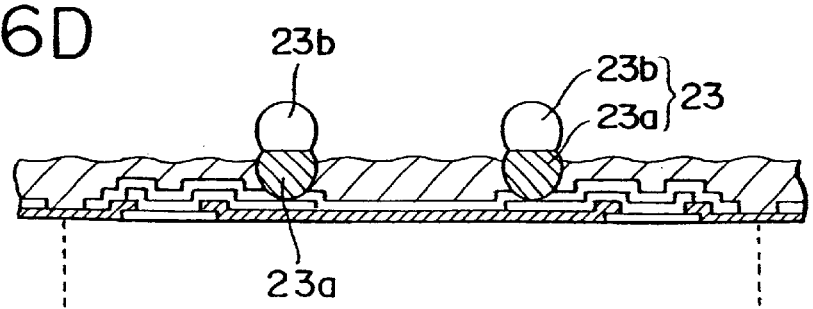
Figure 7:
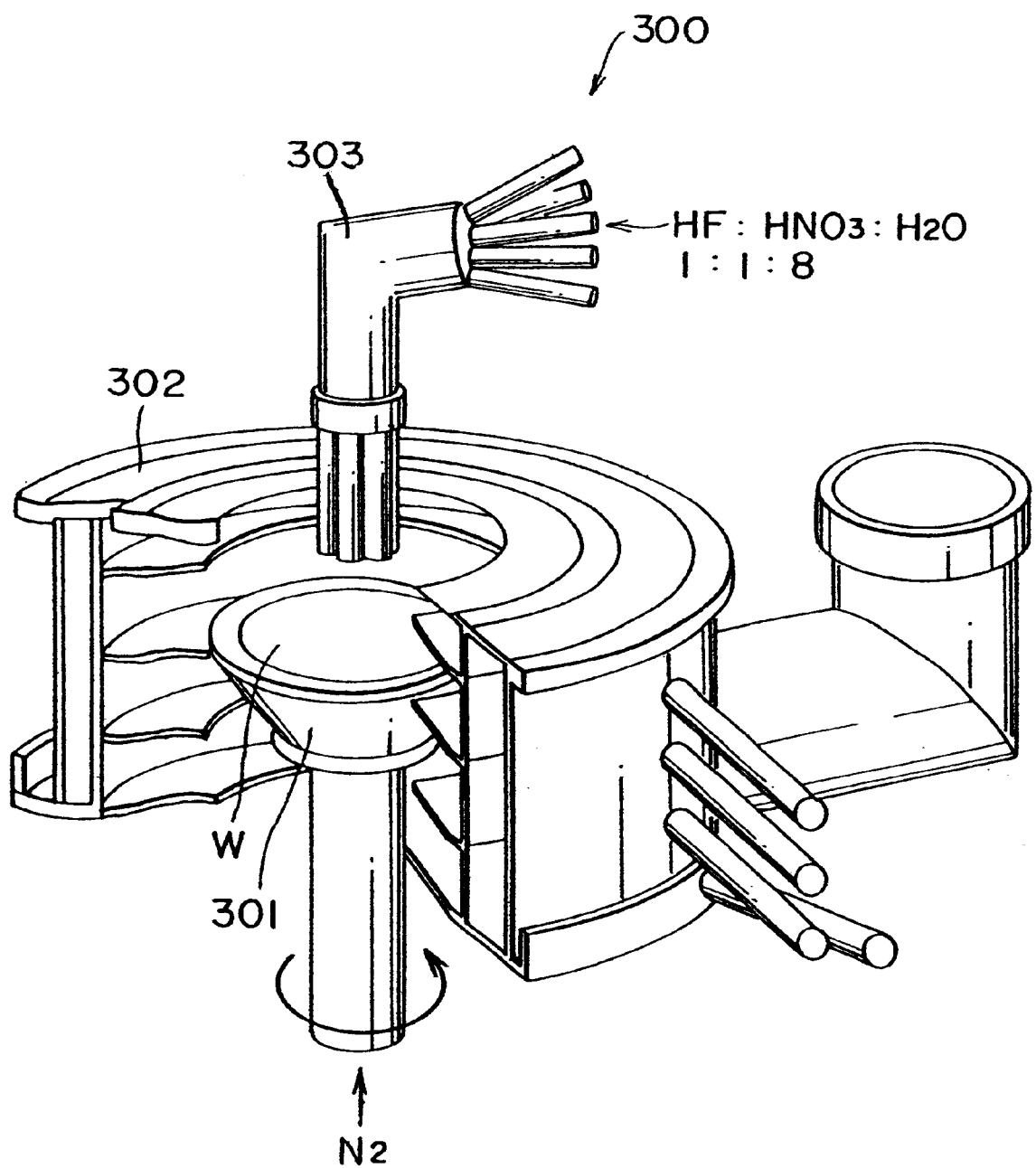
FIG. 7 shows the etching machine which is used during wafer thinning in the method for manufacturing the semiconductor device of the present invention.

FIGS. 6 to 8 shows another preferred embodiment of the method for manufacturing a semiconductor device of the present invention.

First, in FIG. 6A, almost spherical third protrusion electrodes 23a using high-melting solder are formed in the place redisposed with a BLM film from electrode pad 25 around respective semiconductor chips 20 of the wafer W. The inner bump 23 is formed on the BLM film 27 exposed from the opening section 28a of a polyimide film 28.

Next, as shown in FIG. 6B, after liquid resin 24 such as epoxy resin or suchlike is applied to the whole surface of the wafer in a manner of spin coating, the liquid resin 24 is hardened by thermal treatment of curing at approx. 150° C. for about five hours.

Further, a protective tape PT is pasted on the surface of the wafer W where the third protrusion electrodes 23a are formed, and the back of the wafer W is ground by means of the grinding machine shown in FIG. 3. At this time, the grinding is performed at the feed speed of the grinding stone of 150 μm/min and at the rotation speed of the grinding stone of 2500 rpm so that the thickness of the ground wafer W is 150 μm. In this way, the wafer W is thinned removing flaws from the back of the wafer W.

Next, the back of the wafer W is etched by the spin etching machine 300 as shown in FIG. 7. Concretely, the wafer W is rotatably held by the chuck 301 and disposed in the chamber 302. In the machine, the rotation speed of the wafer W is controlled to be 200 rpm, for example. Further, agent liquid having a composition of $HF:HNO_3:H_2=1:1:8$ is supplied to the wafer W from an agent liquid supply means disposed over the wafer W at a supply amount of 40 l/min. Then, the back of the wafer W is etched and thinned removing flaws from the back until the thickness d1 of the wafer W reaches 100 μm, for example.

Subsequently, as shown in FIG. 6C, the tops of the third protrusion electrodes 23a are planarized by the polishing machine. In this process, the polishing machine as shown in FIG. 3 is used as a polishing machine.

After that, as shown in FIG. 6D, fourth protrusion electrodes 23b are formed using eutectic solder on the planarized tops of the third protrusion electrodes 23a by a ball transfer method. In this case, the fourth protrusion electrodes 23b are joined to the third protrusion electrodes 23a to form inner bumps 23. After that, semiconductor chips 20 are cut out from the wafer W by dicing.

Figure 8A:
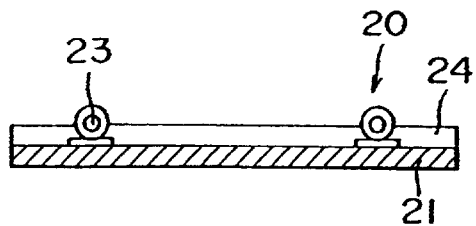
FIGS. 8A to 8D are process diagrams showing another embodiment of the manufacturing method for the semiconductor device of the present invention.
Figure 8B:
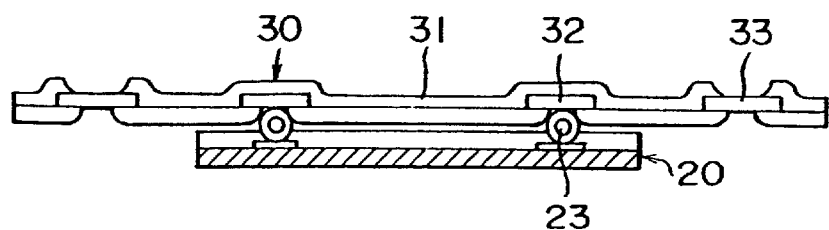
Figure 8C:
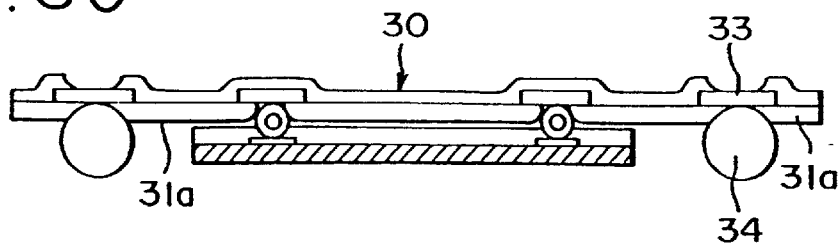
Figure 8D:
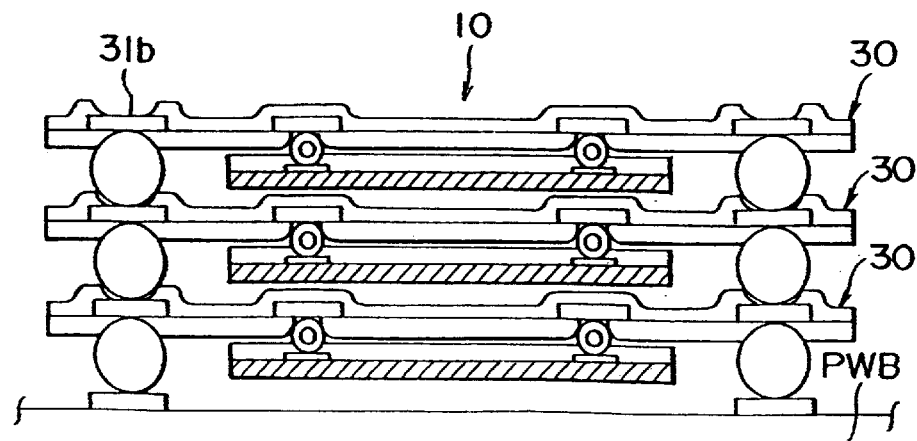
Figure 9A:
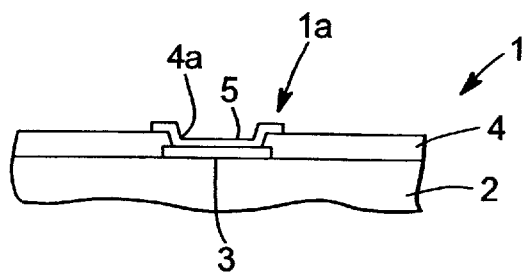
FIGS. 9A to 9E are process diagrams showing the state of forming a protrusion electrode on a semiconductor chip of the related art.
Figure 9B:
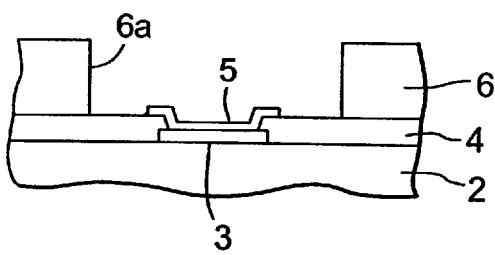
Figure 9C:
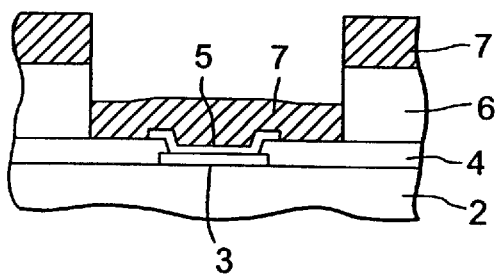
Figure 9D:
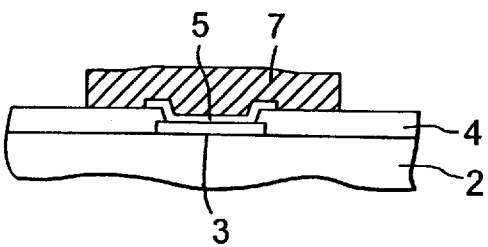
Figure 9E:
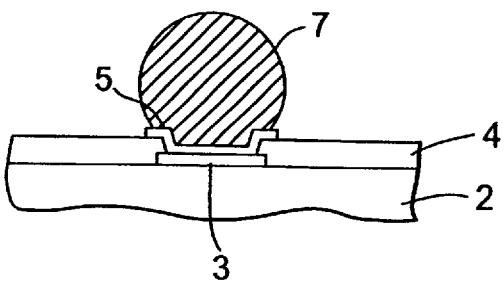

The semiconductor chips 20, shown in FIG. 8A, manufactured according to the above embodiment are mounted on the printed wiring board (PWB) as shown in FIG. 8D.

First, as shown in FIG. 8B, there is provided a base substrate 21 made of polyimide and formed to the thickness d2 of approx. 150 μm. Then, the electrode pad 22 of the base substrate 21 and inner bump 23 are joined, for example, by flip-chip mounting.

Further, as shown in FIG. 8C, the outer bumps 34 are joined to the outer land 33. In this case, the outer bumps 34 are provided on the other surface 31a, that is, on the surface where the semiconductor chip 20 is installed.

Lastly, as shown in FIG. 8D, a plurality of intermediate substrates having outer bumps 34 are joined to the outer land 33 of another intermediate substrate to stack the substrates in layers to complete a semiconductor device 10.

By polishing the tops of the third protrusion electrodes 23a, the resin 24 remaining on the tops of the third protrusion electrodes 23a are completely removed and the surfaces of the tops becomes clean. And, by forming the fourth protrusion electrodes 23b on such clean surfaces, connection resistance of the boundary between the third protrusion electrode 23a and the fourth protrusion electrode 23b is reduced to complete a lower resistance and high performance inner bump 23. Further, the planarization of the third protrusion electrodes 23a by polishing evens the height of the inner bump 23 reducing mounting defects that occurs. In other words, by forming the fourth protrusion electrode 23b by a ball transfer method evens the ball transfer amount and further evens the height of the inner bump 23.

Therefore, according to the second embodiment, the reliability and durability of the flip-chip mounting of the semiconductor IC 11 on the printed wiring board 30 is improved much more than the case of the first embodiment.

According to the above embodiments, the very thin three-dimensional mounting of semiconductor devices in layers is enabled with high reliability and high performance, and thus much smaller-sized and more lightweight electronic equipment can be manufactured. In other words, in the above embodiments, since the length of wiring between semiconductor chips 20 is much shorter than those for prior surface mounting and mounting by stacking in layers with wiring, high-performance semiconductor devices being capable of high-speed signal processing with inductance reduced can be provided. Small-sized and lightweight equipment manufacturing can therefore be realized in the electronic equipment in which the semiconductor device 10 is incorporated, in particular in the field of portable electronic equipment such as IC cards, portable telephones, PDA, and so on.

The embodiment of the present invention is not limited to the above described embodiments.

In the above embodiments, although the fourth protrusion electrode 23b is formed by a ball transfer method, it is clear that other methods such as a printing method, a transfer method, and a plating method can be used instead of the ball transfer method.

The etching machine used in the processes as shown in FIG. 8 is, what is called, a wet etching machine, and a dry etching machine with a plasma processing apparatus using halogen gas may also be used.

Further, although an electrode is exposed at one surface 31a to the inner land 32 of the intermediate substrate 30, the electrode may be exposed at the other surface 31b to dispose the semiconductor chip 20 on the other surface 31b. In this case, in FIG. 1, the first protrusion electrode 23 and the first outer terminal 32 are formed inside the outer land 33 and the outer bump 34, but the second outer terminal 33 and the protrusion electrode 34 may also be formed inside the first protrusion electrode 23 and the first outer terminal 32.

What is claimed is:

1. A semiconductor device comprising:

a plurality of stackable intermediate mounting substrates, each intermediate substrate being formed of a base substrate and a semiconductor chip substrate, the semiconductor chip substrate having a first protrusion electrode formed thereon, and the base substrate having first and second electrode portions, the first electrode portion having a first exposed surface whereby the first electrode portion is joined to the first protrusion electrode, the second electrode portion formed within the base substrate and having first and second exposed surfaces exposed on first and second sides of the base substrate respectively, and a second protrusion electrode formed on at least one of said first and second exposed surfaces of the second electrode portion, whereby said plurality of intermediate mounting substrates may be joined to one another.

2. The semiconductor device of claim 1 wherein said semiconductor chip substrate is formed having a thickness of 200 μm or less.

3. A semiconductor device as claimed in claim 1, wherein the thickness of said base substrate of said intermediate substrate is formed into approx. 200 μm or less.

4. A semiconductor device as claimed in claim 1, wherein resin is filled in a space between the semiconductor chip substrate and the base substrate.

5. A semiconductor device as claimed in claim 1, wherein the thickness of said second protrusion electrode in the direction said plurality of intermediate substrates are stacked is approx. 300 μm or less.

* * * * *